(12) United States Patent
Klem et al.

(10) Patent No.: US 8,742,398 B2
(45) Date of Patent: Jun. 3, 2014

(54) QUANTUM DOT-FULLERENE JUNCTION BASED PHOTODETECTORS

(75) Inventors: Ethan Klem, Durham, NC (US); John Lewis, Durham, NC (US)

(73) Assignee: Research Triangle Institute, Int'l., Durham, NC (US)

( * ) Notice: Subject to any disclaimer, the term of this patent is extended or adjusted under 35 U.S.C. 154(b) by 126 days.

(21) Appl. No.: 13/499,038

(22) PCT Filed: Sep. 29, 2010

(86) PCT No.: PCT/US2010/050731
§ 371 (c)(1),
(2), (4) Date: May 15, 2012

(87) PCT Pub. No.: WO2011/041421
PCT Pub. Date: Apr. 7, 2011

(65) Prior Publication Data
US 2012/0223291 A1    Sep. 6, 2012

Related U.S. Application Data

(60) Provisional application No. 61/246,679, filed on Sep. 29, 2009, provisional application No. 61/312,494, filed on Mar. 10, 2010.

(51) Int. Cl.
*H01L 29/06* (2006.01)

(52) U.S. Cl.
USPC ..................................... 257/21; 257/E31.058

(58) Field of Classification Search
USPC .................... 257/21, 233, 234, 440, E31.058, 257/E25.032, E23.074, E23.165, E51.039, 257/E29.071; 428/835.3; 977/734
See application file for complete search history.

(56) References Cited

U.S. PATENT DOCUMENTS

| 4,965,649 A | 10/1990 | Zanio et al. |
| 5,077,593 A | 12/1991 | Sato et al. |
| 5,505,928 A | 4/1996 | Alivisatos et al. |
| 5,949,064 A | 9/1999 | Chow et al. |
| 6,207,229 B1 | 3/2001 | Bawendi et al. |
| 6,300,612 B1 | 10/2001 | Yu |

(Continued)

FOREIGN PATENT DOCUMENTS

| JP | 2004165516 A | 6/2004 |
| JP | 2008509559 A | 3/2008 |

(Continued)

OTHER PUBLICATIONS

Rausch et al., "Near-Infrared Imaging with Quantum-Dot-Sensitized Organic Photodiodes," Nature Photonics, vol. 3, Jun. 2009.

(Continued)

*Primary Examiner* — Brook Kebede
(74) *Attorney, Agent, or Firm* — Olive Law Group, PLLC

(57) ABSTRACT

A photodetector includes one or more photodiodes and a signal processing circuit. Each photodiode includes a transparent first electrode, a second electrode, and a heterojunction interposed between the first electrode and the second electrode. Each heterojunction includes a quantum dot layer and a fullerene layer disposed directly on the quantum dot layer. The signal processing circuit is in signal communication each the second electrode. The photodetector may be responsive to wavelengths in the infrared, visible, and/or ultraviolet ranges. The quantum dot layer may be treated with a chemistry that increases the charge carrier mobility of the quantum dot layer.

33 Claims, 7 Drawing Sheets

(56) References Cited

U.S. PATENT DOCUMENTS

| | | | |
|---|---|---|---|
| 6,329,668 | B1 | 12/2001 | Razeghi |
| 6,455,872 | B1 | 9/2002 | Williams et al. |
| 6,504,196 | B1 | 1/2003 | Rhodes |
| 6,580,027 | B2 | 6/2003 | Forrest et al. |
| 6,710,366 | B1 | 3/2004 | Lee et al. |
| 6,852,920 | B2 | 2/2005 | Sager et al. |
| 6,878,871 | B2 | 4/2005 | Scher et al. |
| 6,906,326 | B2 | 6/2005 | Koch et al. |
| 6,972,431 | B2 | 12/2005 | Forrest et al. |
| 7,042,029 | B2 | 5/2006 | Graetzel et al. |
| 7,326,908 | B2 | 2/2008 | Sargent et al. |
| 7,391,024 | B2 | 6/2008 | Garber et al. |
| 7,459,686 | B2 | 12/2008 | Syllaios et al. |
| 2001/0028055 | A1 | 10/2001 | Fafard et al. |
| 2006/0032530 | A1 | 2/2006 | Afzali-Ardakani et al. |
| 2006/0138396 | A1 | 6/2006 | Lin et al. |
| 2006/0159611 | A1* | 7/2006 | Hummelen et al. ...... 423/445 B |
| 2006/0243959 | A1 | 11/2006 | Sargent et al. |
| 2007/0025139 | A1 | 2/2007 | Parsons |
| 2007/0096078 | A1 | 5/2007 | Lee et al. |
| 2007/0215860 | A1 | 9/2007 | Komiyama et al. |
| 2008/0048102 | A1 | 2/2008 | Kurtz et al. |
| 2008/0063566 | A1* | 3/2008 | Matsumoto et al. ......... 422/68.1 |
| 2008/0128021 | A1 | 6/2008 | Choudhury et al. |
| 2008/0178924 | A1 | 7/2008 | Kempa et al. |
| 2008/0202581 | A1 | 8/2008 | Kempa |
| 2008/0216894 | A1 | 9/2008 | Hammond |
| 2008/0230120 | A1 | 9/2008 | Reddy |
| 2009/0101953 | A1 | 4/2009 | Hayashi et al. |
| 2012/0223291 | A1 | 9/2012 | Klem et al. |
| 2012/0241723 | A1 | 9/2012 | Klem et al. |

FOREIGN PATENT DOCUMENTS

| | | |
|---|---|---|
| JP | 2009099866 A | 5/2009 |
| JP | 2009532851 A | 9/2009 |
| WO | 2006017530 A1 | 2/2006 |
| WO | 2007098378 A1 | 8/2007 |

OTHER PUBLICATIONS

Dissanayake et al., "Measurement and Validation of PbS nanocrystal Energy Levels," Applied Physics Letters, vol. 93, 043501, 2008.

Bjorstrom et al., "Multilayer Formation in Spin-Coated Thin Films of Low-Bandgap Polyfluorene:PCBM Blends," J. Phys.: Condens. Matter, vol. 17, 2005, L529-L534.

Wu et al., "Programmable Organic Light-Emitting Devices," Applied Physics Letters, vol. 79, No. 19, Nov. 5, 2001.

Osedach et al., "Lateral Heterojunction Photodetector Consisting of Molecular Organic and Colloidal Quantum Dot Thin Films," Applied Physics Letters, vol. 94, 043307, 2009.

Kim et al., "Contact Printing of Quantum Dot Light-Emitting Devices," Nano Letters, American Chemical Society, 2008.

Sargent, "Infrared Photovoltaics Made by Solution Processing," Nature Photonics, vol. 3, Jun. 2009.

McBranch et al., Optical Limiting in Fullerene Solutions and Doped Glasses,: SPIE Proceedings, "Fullerenes and Photonics II," San Diego, CA, 1985.

Liu, "Quantum Dot Infrafed Photodetector," Opto-Electronics Review, vol. 11, No. 1, pp. 1-5, 2003.

Dissanayake, Dmnm et al.; "The fabrication and analysis of a PbS nanocrystal: C60 bilayer hybrid photovoltaic system", Nanotechnology, IOP Publishing, Bristol, GB, vol. 20:24; Jun. 17, 2009; p. 245202, 5 pp.

Dissanayakek, N. et al., "Organic: PbS-nanocrystal: Fullerene Hybrid Photovoltaics", Materials Research Society, Symp. Proc. vol. 1102, No. 1102-LL07-06, 2008, p. 59-65.

Int'l. Search Report and Written Opinion mailed Dec. 13, 2010 for corresponding Int'l Patent Application No. PCT/US2010/050731 and references cited therein.

Int'l Preliminary Report on Patentability and Written Opinion mailed Apr. 12, 2012 for related Int'l. Patent Application No. PCT/US2010/050712 and references cited therein.

Japanese Office Action translation dated Jul. 25, 2013, for Japanese Patent Application No. 2012-531121 and references cited therein.

Japanese Office Action translation dated Aug. 19, 2013, for Japanese Patent Application No. 2012-531123 and references cited therein.

U.S. Non-final Office Action for related U.S. Appl. No. 13/499,024 mailed Jun. 13, 2012, and reference cited therein.

* cited by examiner

QUANTUM DOT-FULLERENE JUNCTION BASED PHOTODETECTORS

RELATED APPLICATIONS

This application is the national stage of International Application No. PCT/US2010/050731, filed Sep. 29, 2010, titled "QUANTUM DOT-FULLERENE JUNCTION BASED PHOTODETECTORS;" which claims the benefit of U.S. Provisional Patent Application Ser. No. 61/246,679, filed Sep. 29, 2009, titled "QUANTUM DOT-FULLERENE JUNCTION OPTOELECTRONIC DEVICES;" and U.S. Provisional Patent Application Ser. No. 61/312,494, filed Mar. 10, 2010, titled "QUANTUM DOT-FULLERENE JUNCTION BASED PHOTODETECTORS;" the contents of which are each incorporated by reference herein in their entireties.

TECHNICAL FIELD

The present invention relates generally to photodetectors. In particular, the invention relates to photodetectors including heterojunctions formed by quantum dot and fullerene layers, and methods for fabricating such heterojunctions and photodetectors.

BACKGROUND

Optoelectronic devices include photovoltaic (PV) devices (solar cells), photodetectors, and like devices, as well as electroluminescent (EL) devices such as light-emitting diodes (LEDs) and laser diodes (LDs). A PV device generates electric power when electromagnetic radiation is incident upon its active layer. The power may be utilized by a resistive load (e.g., battery, electrical power-consuming device, etc.) connected across the PV device. When sunlight is utilized as the source of incident electromagnetic radiation, the PV device may be referred to as a solar cell. A photodetector operates similarly to a PV device, but is configured to detect the occurrence of incident light and/or measure the intensity, attenuation or transmission of incident light and thus may be utilized in various optical sensing and imaging applications. The operation of a photodetector typically entails the application of an external bias voltage whereas the operation of a PV device does not. Moreover, a photodetector often detects only a narrow range of wavelengths (e.g, an infrared (IR) detector or ultraviolet (UV) detector), whereas a PV device is typically desired to be responsive to as wide a range of wavelengths as possible for maximum generation of electrical power. It would, however, be desirable to provide a photodetector that is capable of detecting a broad range of wavelengths, such as from visible to IR or UV to IR.

A photodetector, PV device or related optoelectronic device may be based on a junction formed by a pair of two different types of semiconductors (e.g., an n-type and a p-type material, or an electron acceptor and an electron donor material). When a photon's energy is higher than the band gap value of the semiconductor, the photon can be absorbed in the semiconductor and the photon's energy excites a negative charge (electron) and a positive charge (hole). For the excited electron-hole pair to be successfully utilized in an external electrical circuit, the electron and the hole must first be separated before being collected at and extracted by respective opposing electrodes. This process is called charge separation and is required for photoconductive and photovoltaic effects to occur. If the charges do not separate they can recombine and thus not contribute to the electrical response generated by the device.

In photodetectors, PV devices and related optoelectronic devices, a key figure of merit is quantum efficiency, which includes both external quantum efficiency (EQE) and internal quantum efficiency (IQE). EQE corresponds to the percentage of total incident photons that are converted to electrical current, and IQE corresponds to the percentage of total absorbed photons that are converted to electrical current. Another performance-related criterion is the signal-to-noise (S/N) ratio of the device, which generally may be maximized by maximizing the EQE and minimizing the dark current. In addition, charge carrier mobility within the constituent layers is a key material property that affects the performance of the device. Charge carrier mobility describes the velocity of a charge carrier in the presence of an electric field. A larger value of mobility means that charge carriers move more freely and can be extracted from the device more efficiently. This results in higher device performance as compared devices with lower charge carrier mobility. A related property is exciton diffusion length, which describes the average distance that an exciton (a bound electron-hole pair) will travel before the charge carriers recombine. In a photodetector or related device where excitons play a significant role, a larger value means that there is a higher probability that photogenerated excitons will reach a charge separation region prior to recombination, and also leads to a higher device performance as compared to a photodetector device with a lower exciton diffusion length. While mobility and exciton diffusion are separate properties, their values are affected by similar material attributes. For example, defects, charge trapping sites, and grain boundaries all inhibit carrier transport and result in lower mobility as well as lower exciton diffusion length. While enhanced mobility is discussed throughout this document, it is understood that similar results are obtained for enhanced exciton diffusion length.

Conventionally, photodetector devices and other optoelectronic devices have utilized bulk and thin-film inorganic semiconductor materials to provide p-n junctions for separating electrons and holes in response to absorption of photons. In particular, electronic junctions are typically formed by various combinations of intrinsic, p-type doped and n-type doped silicon. The fabrication techniques for such inorganic semiconductors are well-known as they are derived from many years of experience and expertise in microelectronics. Detectors composed of silicon-based p-n junctions are relatively inexpensive when the devices are small, but costs scale approximately with detector area. Moreover, the bandgap of Si limits the range of IR sensitivity to ~1.1 μm. Because silicon has an indirect bandgap and is a relatively inefficient absorber of photons, there is a wide distribution of absorption lengths as a function of wavelength, making it difficult to produce detectors that are simultaneously efficient in the UV and the IR. Group III-V materials such as indium-gallium-arsenide [$In_xGa_yAs$ (x+y=1, 0≤x≤1, 0≤y≤1)], germanium (Ge) and silicon-germanium (SiGe), have been utilized to extend detection further into the IR but suffer from more expensive and complicated fabrication issues. Other inorganic materials such as $Al_xGa_yIn_zN$ (x+y+z=1, 0≤x≤1, 0≤y≤1, 0≤z≤1), SiC, and $TiO_2$ have been used for more efficient UV detection but also suffer from complex fabrication and cost issues.

More recently, optoelectronic devices formed from organic materials (polymers and small molecules) are being investigated, but have enjoyed limited success as photodetectors. The active region in these devices is based on a heterojunction formed by an organic electron donor layer and an organic electron acceptor layer. A photon absorbed in the active region excites an exciton, an electron-hole pair in a bound state that can be transported as a quasi-particle. The photogenerated exciton becomes separated (dissociated or "ionized") when it diffuses to the heterojunction interface. Similar to the case of inorganic PV and photodetector devices, it is desirable to separate as many of the photogenerated excitons as possible and collect them at the respective electrodes before they recombine. It can therefore be advantageous to include layers in the device structure that help confine excitons to charge separation regions. These layers may also serve to help transport one type of charge carrier to one electrode, while blocking other charge carriers, thereby improving the efficiency of charge carrier extraction. While many types of organic semiconductor layers can be fabricated at relatively low-cost, most organic semiconductor layers are not sufficiently sensitive to IR photons, which is disadvantageous in IR imaging applications. Moreover, organic materials are often prone to degradation by UV radiation or heat.

Even more recently, quantum dots (QDs), or nanocrystals, have been investigated for use in optoelectronic devices because various species exhibit IR sensitivity and their optoelectronic properties (e.g., band gaps) are tunable by controlling their size. Thus far, QDs have been employed in prototype optoelectronic devices mostly as individual layers to perform a specific function such as visible or IR emission, visible or IR absorption, or red-shifting. Moreover, optoelectronic devices incorporating QDs have typically exhibited low carrier mobility and short diffusion length.

A photodetector may form the basis of an imaging device such as, for example, a digital camera capable of producing still photographs and/or video streams from an observed scene. The imaging device in such applications typically includes a light-sensitive focal plane array (FPA) composed of many photodetectors and coupled to imaging electronics (e.g., read-out chips). The photodetector of a typical digital camera is based on silicon technology. Silicon digital cameras have offered outstanding performance at low cost by leveraging Moore's Law of silicon technology improvement. The use of silicon alone as the light-absorbing material in such cameras, however, limits the efficient operation of these cameras in the infrared spectrum. Silicon is therefore not useful in the portion of the electromagnetic spectrum known as the short-wavelength infrared (SWIR), which spans wavelengths from ~1.5 to 2.5 μm. The SWIR band is of interest for night vision applications where imaging using night glow and reflected light offers advantages over the longer thermal infrared wavelengths. Similarly, the typical IR-sensitive imaging device composed of, for example, InGaAs, InSb, or HgCdTe is not capable of also performing imaging tasks in the visible and UV ranges. Hence the requirement in many imaging systems for both daytime and nighttime imaging has resulted in the use of multi-component systems containing silicon-based imagers and separate specialized IR imagers. The necessity of utilizing multiple technologies increases costs and complexity. Moreover, SWIR imaging is useful, for example, in military surveillance and commercial security surveillance applications and is considered to have technological advantages over MWIR and LWIR imaging, but thus far has been limited to use in high-performance military applications due to the high costs associated with traditional design and fabrication approaches. Additionally, while FPAs exhibiting good sensitivity to incident IR radiation have been developed based on a variety of crystalline semiconductors, such FPAs conventionally have been required to be fabricated separately from the read-out chips. Conventionally, after separately fabricating an FPA and a read-out chip, these two components are subsequently bonded together by means of alignment tools and indium solder bumps, or other flip-chip or hybridization techniques. This also adds to fabrication complexity and expense.

There is an ongoing need for photodetector devices with improved material properties and performance-related parameters such as more efficient charge separation, greater charge carrier mobility, longer diffusion lengths, higher quantum efficiencies, and sensitivity tunable to a desired range of electromagnetic spectra. There is also a need for lower cost, more reliable and more facile methods for fabricating such photodetector devices, as well as improved integration of the sensing elements with the signal processing electronics, improved scalability for large-area arrays, and applicability to curved, flexible or foldable substrates. There is also a need for photodetector devices that exhibit a sensitivity spanning a broad spectral range, such as both visible and IR or UV, visible and IR, to enable simultaneous detection in these ranges by a single photodetector device.

SUMMARY

To address the foregoing problems, in whole or in part, and/or other problems that may have been observed by persons skilled in the art, the present disclosure provides methods, processes, systems, apparatus, instruments, and/or devices, as described by way of example in implementations set forth below.

According to one implementation, a photodetector includes a photodiode and a signal processing circuit. The photodiode includes a transparent first electrode, a second electrode, and a heterojunction interposed between the first electrode and the second electrode. The heterojunction includes a quantum dot layer and a fullerene layer disposed directly on the quantum dot layer. The signal processing circuit is in signal communication with the second electrode.

According to another implementation, the photodetector includes an electrically insulating layer interposed between the second electrode and the signal processing circuit, and an electrically conductive interconnect disposed in a via formed through the insulating layer, wherein the signal processing circuit is in signal communication with the second electrode through the interconnect. The photodetector may further include an encapsulating layer disposed on the first electrode.

The quantum dots may be visible light-sensitive quantum dots, infrared-sensitive quantum dots, ultraviolet-sensitive quantum dots, or a combination of two or more of the foregoing.

According to another implementation, an electron blocking layer is interposed between the second electrode and the quantum dot layer. In some implementations, the electron blocking layer is a discontinuous layer.

According to another implementation, a photodiode includes a quantum dot-fullerene junction, wherein the quantum dot layer exhibits a charge carrier mobility greater than $1 \times 10^{-4}$ V/cm$^2$-sec.

According to another implementation, a photodiode includes a quantum dot-fullerene junction, wherein the quantum dot layer exhibits a charge carrier mobility greater than $5 \times 10^{-4}$ V/cm$^2$-sec.

According to another implementation, a photodiode includes a quantum dot-fullerene junction, wherein the quantum dot layer exhibits a charge carrier mobility ranging from greater than $1 \times 10^{-4}$ V/cm$^2$-sec to 10 V/cm$^2$-sec.

According to another implementation, a photodiode includes a quantum dot-fullerene junction, wherein the quantum dot layer has an interparticle spacing of 2 nm or less.

According to another implementation, a hole blocking layer is interposed between the first electrode and the fullerene layer.

According to another implementation, a photodetector includes a plurality of photodiodes and a signal processing circuit. Each photodiode includes a transparent first electrode, a second electrode, and a heterostructure interposed between the first electrode and the second electrode. Each heterostructure includes a quantum dot layer and a fullerene layer disposed directly on the quantum dot layer. The signal processing circuit is in signal communication with each second electrode.

In one implementation, the photodiodes are arranged in a linear array. In another implementation, the photodiodes are arranged in a two-dimensional array.

According to another implementation, the plurality of photodiodes includes a first group of photodiodes configured for outputting respective signals responsive to incident photons of infrared wavelengths, a second group of photodiodes configured for outputting respective signals responsive to incident photons of visible wavelengths, and a third group of photodiodes configured for outputting respective signals responsive to incident photons of ultraviolet wavelengths.

According to another implementation, the respective first electrodes are collectively structured as a single ground plane in signal communication with each heterostructure. An encapsulating layer may be disposed on the ground plane.

According to another implementation, a method is provided for fabricating a photodetector. A heterostructure is formed on a first electrode and includes a quantum dot layer and a fullerene layer in contact with each other. A transparent second electrode is formed on a side of the heterostructure opposite to the first electrode. The first electrode is placed in signal communication with a signal processing circuit.

In one implementation, the first electrode is bonded to the signal processing circuit. In another implementation, the first electrode is deposited on the signal processing circuit prior to forming the heterostructure.

According to another implementation, an electron blocking layer is formed on the first electrode, and the quantum dot layer is formed on the electron blocking layer. In some implementations, the effectiveness of the electron blocking layer may be improved by subjecting the electron blocking layer to an oxidizing or reducing treatment, such as by annealing the electron blocking layer in various oxidizing or reducing atmospheres or exposing the electron blocking layer to an oxidizing or reducing plasma.

According to another implementation, a hole blocking layer is formed on the fullerene layer.

According to another implementation, after depositing the quantum dot layer, the quantum dot layer is chemically treated to increase the charge carrier mobility of the quantum dot layer.

According to another implementation, the quantum dot layer is treated with a chemistry that reduces an interparticle spacing between quantum dots. In some implementations, the resulting interparticle spacing is 2 nm or less.

According to another implementation, the quantum dot layer is treated with a chemistry that reduces the as-deposited thickness of the quantum dot layer. In some implementations, the thickness is reduced by 20 to 80%.

According to another implementation, an electrically insulating layer is deposited on the signal processing circuit, a via is formed through the insulating layer, the via is filled with an electrically conductive material to form an interconnect, and the first electrode is deposited on the insulating layer and in contact with the interconnect.

According to another implementation, a plurality of photodiodes is fabricated by forming a plurality of heterostructures on a plurality of respective first electrodes, with each heterostructure including a respective quantum dot layer and a respective fullerene layer in contact with each other. The transparent second electrode is formed on a side of the heterostructures opposite to the first electrodes. Each first electrode is placed in signal communication with the signal processing circuit. The transparent second electrode may be formed so as to be in signal communication with each heterostructure.

According to another implementation, a hole blocking layer or an exciton blocking layer is deposited so as to be interposed between the fullerene layer and the first electrode.

According to another implementation, an electron blocking layer or an exciton blocking layer is deposited so as to be interposed between the quantum dot layer and the second electrode.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood by referring to the following figures. The components in the figures are not necessarily to scale, emphasis instead being placed upon illustrating the principles of the invention. In the figures, like reference numerals designate corresponding parts throughout the different views.

DETAILED DESCRIPTION

Figure 1:
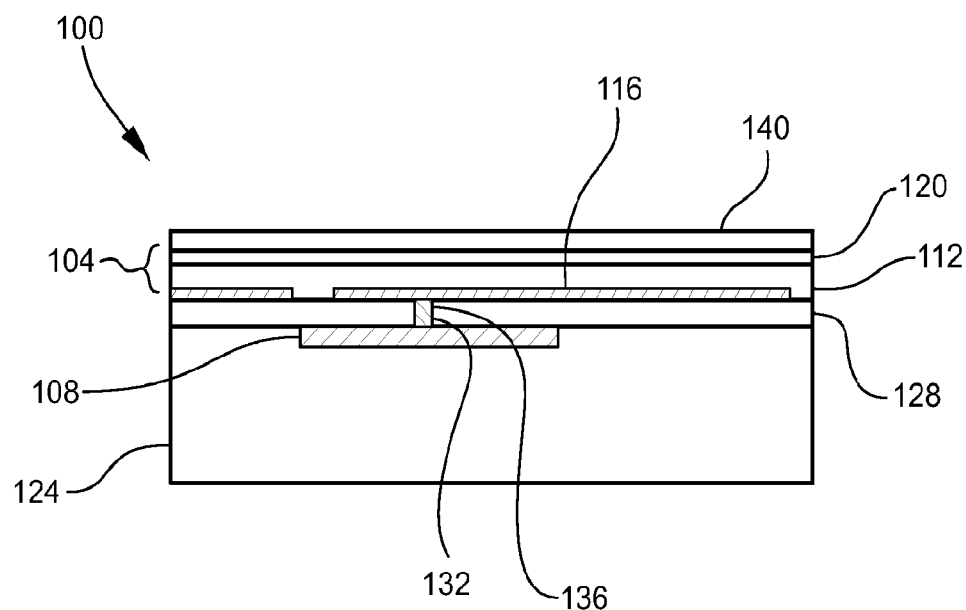
FIG. 1 is a cross-sectional view of an example of a photodetector according to certain implementations of the present disclosure.

For purposes of the present disclosure, it will be understood that when a layer (or film, region, substrate, component, device, or the like) is referred to as being "on" or "over" another layer, that layer may be directly or actually on (or over) the other layer or, alternatively, intervening layers (e.g., buffer layers, transition layers, interlayers, sacrificial layers, etch-stop layers, masks, electrodes, interconnects, contacts, or the like) may also be present. A layer that is "directly on" another layer means that no intervening layer is present, unless otherwise indicated. It will also be understood that when a layer is referred to as being "on" (or "over") another layer, that layer may cover the entire surface of the other layer or only a portion of the other layer. It will be further understood that terms such as "formed on" or "disposed on" are not intended to introduce any limitations relating to particular methods of material transport, deposition, fabrication, surface treatment, or physical, chemical, or ionic bonding or interaction. The term "interposed" is interpreted in a similar manner.

As used herein, the term "optoelectronic device" generally refers to any device that acts as an optical-to-electrical transducer or an electrical-to-optical transducer. Accordingly, the term "optoelectronic device" may refer to, for example, a photovoltaic (PV) device (e.g., a solar cell), a photodetector, a thermovoltaic cell, or electroluminescent (EL) devices such as light-emitting diodes (LEDs) and laser diodes (LDs). PV and photodetector devices are described briefly above and detailed examples of certain photodetector devices are described below. In a general sense, EL devices operate in the reverse of PV and photodetector devices. Electrons and holes are injected into the semiconductor region from the respective electrodes under the influence of an applied bias voltage. One of the semiconductor layers is selected for its light-emitting properties rather than light-absorbing properties. Radiative recombination of the injected electrons and holes causes the light emission in this layer. Many of the same types of materials employed in PV and photodetector devices may likewise be employed in EL devices, although layer thicknesses and other parameters must be adapted to achieve the different goal of the EL device. Optoelectronic devices such as the foregoing are further described in U.S. Provisional App. No. 61/246,679, filed Sep. 29, 2009, incorporated by reference herein in its entirety.

As used herein, the term "fullerene" refers to the buckminsterfullerene $C_n$ as well as other forms of molecular carbon, such as $C_{70}$, $C_{84}$, and similar cage-like carbon structures, and more generally may range from 20 to several hundreds of carbon atoms, i.e., $C_n$ where n is 20 or greater. The fullerene may be functionalized or chemically modified as desired for a specific purpose such as, for example, improving solubility or dispersability or modifying the electrical properties of the fullerene. The term "fullerene" may also refer to endohedral fullerenes wherein a non-carbon atom or atomic cluster is enclosed in the carbon cage. The term "fullerene" may also refer to fullerene derivatives. A few non-limiting examples of fullerene derivatives are [6,6]-phenyl-$C_{61}$-butyric acid methyl ester (PCBM) and phenyl-$C_{61}$-butyric acid cholestryl ester (PCBCR). The term "fullerene" may also refer to blends of the previously mentioned forms of fullerenes.

As used herein, the term "quantum dot" or "QD" refers to a semiconductor nanocrystal material in which excitons are confined in all three spatial dimensions, as distinguished from quantum wires (quantum confinement in only two dimensions), quantum wells (quantum confinement in only one dimension), and bulk semiconductors (unconfined). Also, many optical, electrical and chemical properties of the quantum dot may be strongly dependent on its size, and hence such properties may be modified or tuned by controlling its size. A quantum dot may generally be characterized as a particle, the shape of which may be spheroidal, ellipsoidal, or other shape. The "size" of the quantum dot may refer to a dimension characteristic of its shape or an approximation of its shape, and thus may be a diameter, a major axis, a predominant length, etc. The size of a quantum dot is on the order of nanometers, i.e., generally ranging from 1-1000 nm, but more typically ranging from 1-100 nm, 1-20 nm or 1-10 nm. In a plurality or ensemble of quantum dots, the quantum dots may be characterized as having an average size. The size distribution of a plurality of quantum dots may or may not be monodisperse. The quantum dot may have a core-shell configuration, in which the core and the surrounding shell may have distinct compositions. The quantum dot may also include ligands attached to its outer surface, or may be functionalized with other chemical moieties for a specific purpose.

As used herein, the term "electronic heterojunction" refers to two layers of dissimilar materials juxtaposed and in direct contact with each other. One layer serves as an electron donor while the other layer serves as an electron acceptor, such as may be utilized to form a photodiode. The term "electronic heterojunction" encompasses the term "photovoltaic heterojunction" but also refers to a heterojunction as may be employed in an EL device, where one layer serves as a light-emissive layer in response to exciton decay, or the returning of an exciton to its unexcited state.

For purposes of the present disclosure, the spectral ranges or bands of electromagnetic radiation are generally taken as follows, with the understanding that adjacent spectral ranges or bands may be considered to overlap with each other to some degree: UV radiation may be considered as falling within the range of about 10-400 nm, although in practical applications (above vacuum) the range is about 200-400 nm. Visible radiation may be considered as falling within the range of about 380-760 nm. IR radiation may be considered as falling within the range of about 750-100,000 nm. IR radiation may also be considered in terms of sub-ranges, examples of which are as follows. SWIR radiation may be considered as falling within the range of about 1,000-3,000 nm. MWIR radiation may be considered as falling within the range of about 3,000-5,000 nm. LWIR radiation may be considered as falling within the range of about 8,000-12,000 nm.

As described by way of examples below, quantum dot photodiode (QDP) technology is implemented to provide low-cost nanotechnology-enabled photodetectors. In some implementations, the photodetectors may be configured to efficiently detect light with sensitivity spanning a spectral region ranging from about 250-2400 nm. Thus, the photodetectors may be configured as a multispectral device capable of producing images from incident ultraviolet (UV), visible and/or infrared (IR) electromagnetic radiation. In some implementations, the spectral range of sensitivity may extend down to X-ray energies and/or up to IR wavelengths longer than 2400 nm. The photodetectors as taught herein are cost effective, scalable to large-area arrays, and applicable to flexible substrates.

FIG. 1 is a schematic cross-sectional view of an example of a photodetector 100 according to certain implementations of the present disclosure. The photodetector 100 generally includes a photodiode 104 in signal communication with a signal processing circuit (or electronics) 108. The photodiode 104 generally includes a sensor layer 112 sandwiched between two electrically conductive layers 116, 120 serving as electrodes for the photodiode 104. The sensor layer 112 may be characterized as the active, or photoconductive, region of the photodiode 104. That is, in the sensor layer 112 incident photons are absorbed leading to the generation of excitons, the excitons are dissociated leading to the generation of free electrons and holes, and the electrons and holes are transported to the respective conductive layers 120, 116. For these purposes, the sensor layer 112 may include a plurality of function-specific layers, including one or more photon-absorbing layers and one or more electronic heterojunctions suitable for separating excitons into individual charge carriers. In the illustrated example, the holes are collected at the lower conductive layer or electrode 116, which in this case functions as an anode and is in signal communication with the underlying signal processing circuit 108. The electrons are collected at the upper conductive layer or electrode 120, which in this case functions as a cathode and, being on the side of the photodetector 100 exposed to incident electromagnetic radiation to be detected, should be transparent. The other electrode 116 and the substrate 124 may also be transparent. In the present context, the term "transparent" means that a given material is able to efficiently pass at least those photons having wavelengths intended to be detected by the photodetector 100. In typical implementations, a voltage source (not specifically shown) is placed in signal communication with the upper conductive layer 120 and the lower conductive layer 116 to apply a voltage bias (and hence an external electric field) across the layers of the photodiode 104 to promote extraction of the photogenerated charges from the photodiode 104 and thus facilitate detection of the incident photons by the signal processing circuitry 108. The voltage source may be integrated with the signal processing circuitry 108.

Figure 2:
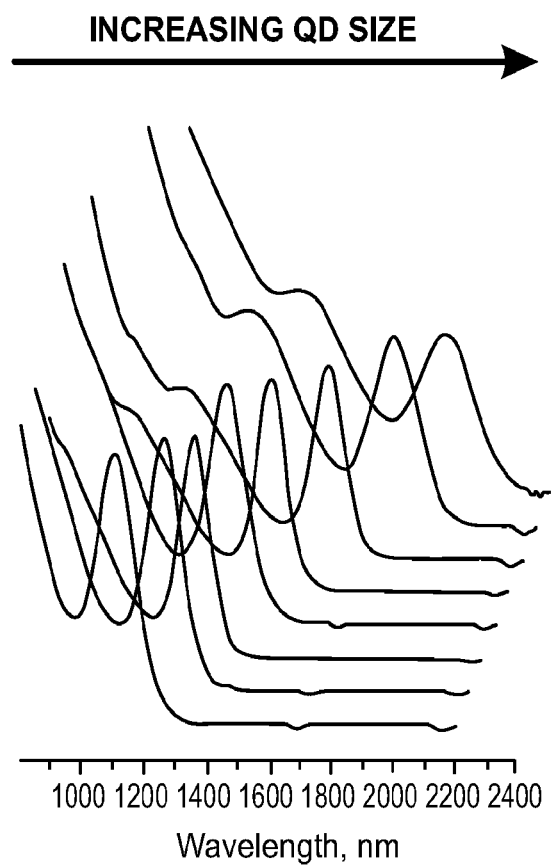
FIG. 2 is a set of absorption intensity measurements as a function of wavelength for a range of sizes of lead sulfide quantum dots.

In certain examples described below, the primary photon-absorbing element of the photodiode 104 is one or more layers of quantum dots (QDs). QDs are advantageous because they function at relatively high temperatures such that the associated photodetector 100 does not require elaborate cooling means, and generally exhibit low dark currents and consequently good signal-to-noise ratio. Moreover, QDs may be produced utilizing relatively low-cost and easily implemented processing techniques, as in the example of solution-processed colloidal QDs. Furthermore, the electrical and optical properties of QDs are tunable by, for example, controlling their size and/or composition during synthesis. As an example, FIG. 2 (from Levina, L. & Sargent Edward, H., unpublished data—PbS Nanocrystals of Varying Sizes, University of Toronto (2007)) is a set of absorption intensity measurements as a function of wavelength for a range of sizes of lead sulfide (PbS) quantum dots. As shown in FIG. 2, as its size increases the PbS QD becomes sensitive to longer wavelengths. Thus, the size and/or composition of QDs may be selected such that a given QD layer absorbs photons up to a maximum wavelength of interest. In addition, two or more QD layers containing the same type (size, composition, etc.) of QDs may be provided in separate vertical levels within the sensor layer 112 of the photodiode 104 to enhance the photoconductive response to a wavelength of interest. Alternatively, a given QD layer may include a mixture of different QDs (different as to composition and/or size) so as to render that particular QD layer sensitive to a range of wavelengths. For example, a single QD layer may be configured to detect UV, visible and IR radiation. Additionally or alternatively, the photodiode 104 may include one QD layer sensitive to a certain range of wavelengths and one or more additional QD layers sensitive to one of more different ranges of wavelengths.

In certain examples described below, each QD layer may be formed in direct contact with a layer of fullerenes to form an electronic heterojunction. The fullerene layer may also be a photon-absorbing layer. For convenience in the present disclosure, the resulting QD-fullerene bilayer structure is referred to as a heterostructure. The sensor layer 112 may include a single QD-fullerene heterostructure or a series of two of more vertically stacked QD-fullerene heterostructures. In the case of more than one heterostructure, the heterostructures may be separated from each other by charge-carrier transporting layers or other types of intervening layers, or may share a QD layer or fullerene layer with each other, i.e., may comprise a series of vertically stacked, alternating QD and fullerene layers.

The signal processing circuitry 108 may be any circuitry configured for receiving (or reading) signals from the lower conductive layer 116 and measuring these signals so that they may be correlated to the intensity of the incident electromagnetic radiation for purposes of monitoring a scene, recording images of the scene, displaying images in real time, etc. The signal processing circuitry 108 may include any functionality necessary for realizing an end-use product incorporating the photodetector 100 (e.g., digital camera, etc.) such as, for example, one or more transistors, voltage buffers, source followers and the like, one or more amplifiers, one or more multiplexers and/or column/row selectors, one or more analog-to-digital converters, control logic and timing circuitry, sensor data fusion circuitry and other types of image processing circuitry (e.g., for constructing an electronic image representing the scene detected by the photodetector), display interface circuitry, and other types of analog and/or digital processing circuitry. The signal processing circuitry 108 may, for example, include a readout integrated circuit (ROIC). The signal processing circuitry 108 may be fabricated on a suitable substrate 124 according to any known technology such as bulk semiconductor technology, non-limiting examples of which include CMOS (complementary metal oxide semiconductor) technology, CCD (charge coupled device) technology, and TFT (thin field effect transistor) technology.

An example of fabricating the photodetector 100 will now be described. In this example, a ROIC is provided by fabricating the signal processing circuitry 108 on a suitable substrate 124 such as silicon, utilizing any suitable fabrication techniques. The photodiode 104 may be fabricated separately and then bonded to the ROIC by means of solder bumps (e.g., flip-chip technology) or other hybridization technology. More advantageously, the photodiode 104 is directly integrated with the ROIC by utilizing the ROIC as a substrate and growing or depositing the lower electrode layer 116 and subsequent layers of the photodiode 104 thereon. In the present example, a planarization layer 128 is first deposited on the ROIC to provide a smoothing and/or passivating interface between the signal processing circuitry 108 and the lower electrode layer 116. The planarization layer 128 may be any suitable electrically insulating material such as various oxides and nitrides. As used herein, the term "insulating" encompasses materials conventionally characterized as either "insulating" or "dielectric." A via 132 is formed through the thickness of the planarization layer 128 to expose an area of the signal processing circuitry 108 with which signal communication from the lower electrode layer 116 is required. The via 132 may be formed by any suitable technique (e.g., masking, etching, lithography, etc.). A vertically oriented, electrically conductive interconnect 136 is formed by filling the via 132 with a metal or metal-like material in accordance with any suitable technique. A metallization step is then performed to deposit the lower electrode layer 116 on the planarization layer 128 such that the lower electrode layer 116 is in signal communication with the interconnect 136 and consequently with the signal processing circuit 108. One or more active heterostructures and any other layers comprising the sensor layer 112 are then deposited on the lower electrode layer 116 by any means such as the techniques described below. The upper electrode layer 120 is then deposited on the sensor layer 112. Optionally, a layer of encapsulating material 140 may be deposited on the upper electrode 120 to serve as a protective layer for the photodetector 100. The encapsulating layer 140 may be composed of any suitable insulating material and, in the arrangement of the present example, should be transparent. Depending on what final packaging steps are performed, the encapsulating layer 140 may be a conformal layer (not shown) that extends vertically downward along the sides of the photodetector 100.

The photodetector 100 illustrated in FIG. 1 may be a complete photodetector that includes a single photodiode 104. Alternatively, the photodetector 100 may include many photodiodes 104, in which case the photodiode 104 illustrated in FIG. 1 may be considered as representing one cell or pixel that is part of a larger array of cells or pixels.

Figure 3:
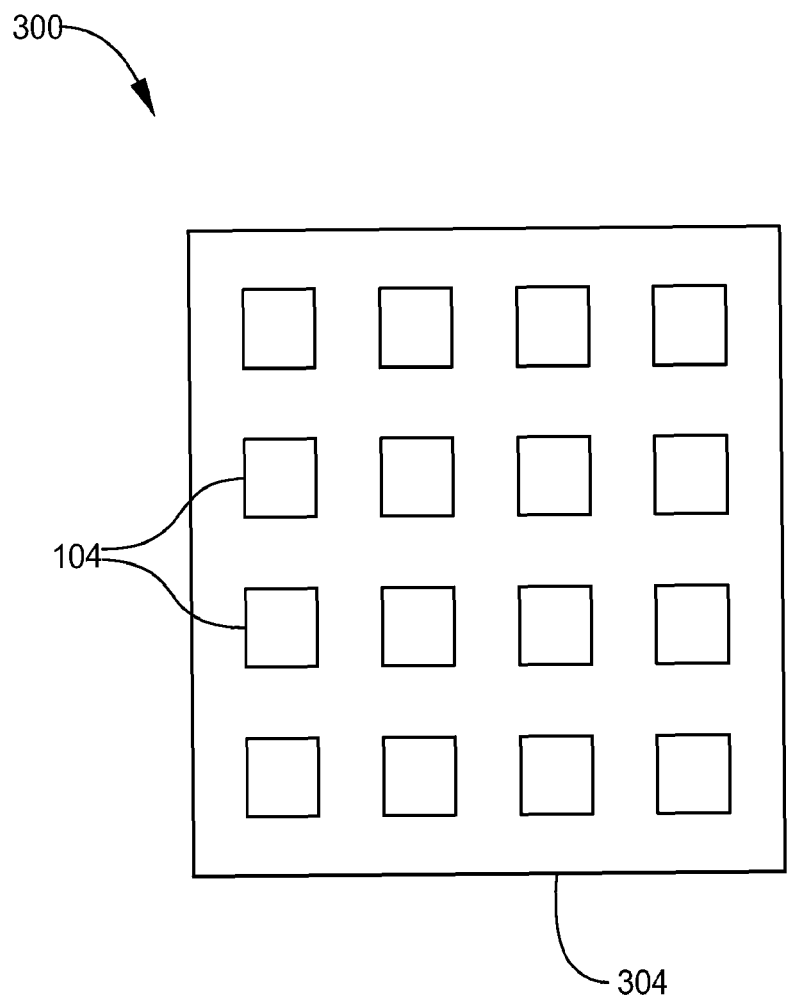
FIG. 3 is a plan view of an example of a photodetector that includes an array of photodiodes according to certain implementations of the present disclosure.

FIG. 3 is a plan view of an example of a photodetector 300 that includes an array of photodiodes 104 according to certain implementations of the present disclosure. In FIG. 3, the photodiodes 104 are diagrammatically depicted as being arranged on a common plane 304. The photodiodes 104 may be arranged as a linear array, i.e., only along a single row or column, or may be arranged as a two-dimensional array (commonly referred to as a focal plane array or FPA) as in the illustrated example. Any number of photodiodes 104 may be provided in the array in accordance with the desired resolution of the photodetector 300. The number of columns do not need to match the number of rows, i.e., the photodetector 300 may include an M×N array of photodiodes 104 where M does not equal N. Moreover, the array may have any shape (e.g., square, rectilinear, polygonal, circular, elliptical, etc.).

Each photodiode 104 of the array illustrated in FIG. 3 may include its own signal processing circuit 108 or at least that part of the signal processing circuit 108 that reads or measures the signal output of that particular photodiode 104. The respective signal outputs of the photodiodes 104 in the array may be multiplexed and further processed by other circuitry integrated with or in signal communication with the respective signal processing circuits 108. All signal processing circuits 108 may be fabricated simultaneously on a common substrate. All photodiodes 104 may then be fabricated simultaneously on the same common substrate. Each photodiode 104 may include its own lower electrode 116, such as by depositing a single conductive layer (or electrode redistribution layer) on the underlying substrate and patterning the conductive layer by any known means. In implementations in which the sensor layer 112 is to be the same for all photodiodes 104 of the array (or a portion of the array), a single sensor layer 112 common to all photodiodes 104 (or to a group of adjacent photodiodes 104) may be deposited on a patterned layer of lower electrodes 116. In this case, each lower electrode 116 may define the size and shape of its associated photodiode 104. Such a configuration does not adversely affect the individual, pixelated nature of the respective photodiodes 104 and cross-talk is not a problem, in view of the lateral spacing (e.g., a few or several microns) between adjacent lower electrodes 116 and the fact that the sensor layer 112 exhibits very low conductivity in the lateral direction. Alternatively, different types of sensor layers 112 may be deposited for different photodiodes 104 or groups of photodiodes 104 by any means now known or later developed. While individual upper electrodes 120 may be formed for each photodiode 104, in other implementations the upper electrodes 120 are collectively provided as a common transparent ground plane by depositing a single conductive layer over all of the as-formed sensor layers 112. Deposition of the common ground plane may be followed by deposition of a single encapsulation layer 140.

In the case of the multi-photodiode photodetector 300 illustrated in FIG. 3, the photodiodes 104 may be configured to detect any desired range of wavelengths by utilizing the QDP technology disclosed herein. Each photodiode 104 may be sensitive to the same wavelength or wavelength range as the other photodiodes 104. As an example, all photodiodes 104 may be sensitive to the same broad range of wavelengths (e.g., UV, visible, and IR, or UV to SWIR, etc.). Alternatively, one or more photodiodes 104 may have a sensitivity that is different from that of the other photodiodes 104 through appropriate selection of QD compositions and fabrication steps of the sensor layer(s) 112, or through the use of appropriate optical filters. As an example, one photodiode 104 or group of photodiodes 104 may be sensitive to IR radiation while the other photodiodes 104 are sensitive to visible and/or UV radiation. Therefore, it is evident that the photodiodes 104 of the photodetector 300 may be configured according to any combination of spectral sensitivities as desired for the end use of the photodetector 300. In one example of an application, the multi-spectral photodetector 300 may be utilized in a digital camera or other type of imaging device whereby the same digital camera is capable of both daytime and nighttime imaging, and imaging under various adverse environmental conditions.

Figure 4:
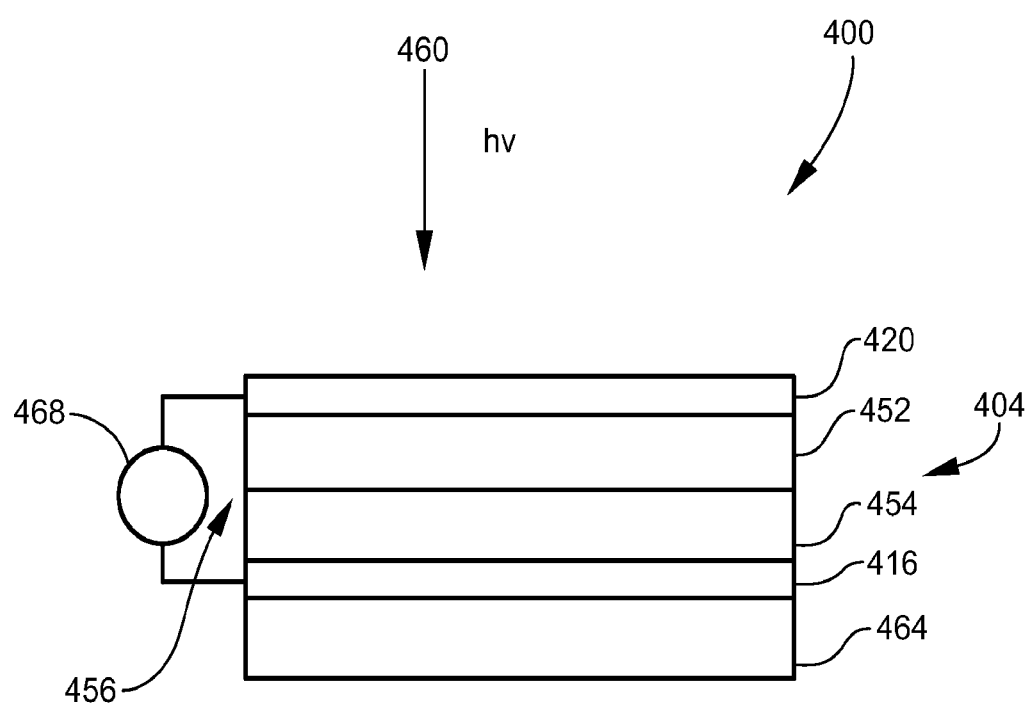
FIG. 4 is a cross-sectional view of an example of a photodiode device according to certain implementations of the present disclosure.

FIG. 4 is a cross-sectional view of an example of a photodiode 400 according to certain implementations of the present disclosure. In some implementations, the photodiode 400 may correspond to the photodiode 104 illustrated in FIG. 1 or any one or more of the photodiodes 104 illustrated in FIG. 3. Generally, the photodiode 400 includes a heterostructure 404 interposed between an upper electrode 420 and a lower electrode 416. It will be understood that the terms "upper" and "lower" are arbitrary in that no limitation is placed on the orientation of the photodiode 400. The heterostructure 404 includes a fullerene layer 452 directly interfaced with a quantum dot (QD) layer 454 to form an electronic heterojunction 456. In this QD-fullerene heterostructure 404, the QD layer 454 serves as an electron donor (or hole transporting) layer and the fullerene layer 452 serves as an electron acceptor (or electron transporting) layer. The QD layer 454 and the fullerene layer 452 are photosensitive, forming excitons in response to absorption of light 460. In the present example, the QD layer 454 is disposed on the electrode 416 (serving as an anode), the fullerene layer 452 is disposed on the QD layer 454, and the electrode 420 (serving as a cathode) is disposed on the fullerene layer 452. In this example, the electrode 420 is intended to transmit incident light 460 and thus is composed of a transparent material. In this case, the electrode 420 may correspond to the transparent ground plane described above in conjunction with FIGS. 1 and 3. The other electrode 416 may also be transparent but is not required to be in the presently illustrated arrangement. The electrode 416 may be formed on any suitable substrate 464, followed by deposition of the other layers.

As appreciated by persons skilled in the art, the photodiode 400 may include additional layers (not shown in FIG. 4) that facilitate rapid propagation of the holes and electrons to their respective electrodes 416 and 420 and/or reduce the probability of electron-hole recombination. Also, the photodiode 400 or an interconnected array of many such photodiodes 400 may be packaged or encapsulated (not shown) as needed by any suitable means known to persons skilled in the art, such as in the example of the array illustrated in FIG. 3.

In operation, electromagnetic radiation 460 passing through the electrode 420 is absorbed in the QD layer 454 and the fullerene layer 452, thus inducing the photogeneration of excitons (electron-hole pairs) in the QD layer 454 and the fullerene layer 452. The excitons are separated into electrons and holes at or near the junction between the QD layer 454 and the fullerene layer 452 or by electric fields present in the respective layers. The electrons are transported through the fullerene layer 452 to the electrode 420 and the holes are transported through the QD layer 454 to the electrode 416. As a result, current flows from the electrode 416 to underlying signal processing circuitry that may be provided with the substrate 464. To enhance this process, the photodiode 400 may be placed in signal communication with a voltage source 468 via electrical lines (wires, etc.) respectively connected to the electrode 420 and the electrode 416 by appropriate attachment means. As appreciated by persons skilled in the art, the signal processing circuitry may be configured to measure the output signal (or image signal) such as current or voltage at the electrode 416 and correlate the measured value with the number of photons incident on the photodiode 400.

The substrate 464 may generally have any composition suitable for fabricating the electrode 416, and may depend on such factors as the type of deposition technique utilized, whether the substrate 464 needs to be transparent, whether the substrate 464 needs to be removed from the electrode 416 after fabrication, the end use of the photodiode 400, etc. Thus, the composition of the substrate 464 may generally include various glasses (including optical-grade), ceramics (e.g., sapphire), metals, dielectric materials, electrically conductive or insulating polymers, semiconductors, semi-insulating materials, etc. In some implementations as described above in conjunction with FIGS. 1 and 3, the substrate 464 may correspond to signal processing circuitry 108 fabricated on a suitable substrate 124 such as may be typical of a ROTC or equivalent circuitry utilized in photodetectors.

The electrode 420 may be any material that is electrically conductive and, when the electrode 420 is intended to receive incident light 460, optically transparent. In the present context, an electrically conductive material is generally one which would be considered acceptable for use as an electrode or contact for passing current in a commercial- or industrial-grade circuit, i.e., with an acceptable low level of resistive loss. An optically transparent material is generally one which passes a sufficient amount of incident light 460 through its thickness to irradiate the QDs of the QD layer 454, i.e., without significant reflection and absorption of photons at the wavelength(s) of interest. As one non-limiting example, a transparent material may be one that permits at least 50% of incident electromagnetic radiation 460 (of a desired wavelength or range of wavelengths) to be transmitted though the thickness of the material. The electrode 420 may also be selected based on its work function. The electrode 420 may cover the entire surface of the underlying fullerene layer 452 or a portion of this surface, as necessary for effectively passing incident photons and collecting a sufficient amount of photogenerated holes. Moreover, more than one physically distinct electrode 420 may be provided.

Examples of the electrode 420 include, but are not limited to, transparent conductive oxides (TCOs), transparent metals, and transparent conductive polymers. TCOs may include, for example, tin oxide (TO), indium tin oxide (ITO), zinc oxide (ZnO), zinc indium oxide (ZIO), zinc indium tin oxide (ZITO), gallium indium oxide (GIO), and further alloys or derivatives of the foregoing. Tin oxide may also be doped with fluorine (F). ZnO may be doped with a Group III element such as gallium (Ga), and/or aluminum (Al), and thus may be more generally stoichiometrically expressed as $Zn_xAl_yGa_zO$ where $x+y+z=1$, $0 \le x \le 1$, $0 \le y \le 1$, and $0 \le z \le 1$. Other metal oxides may be suitable, as well as non-oxide thin-film semiconductors. In the case of metals, various metals (e.g., silver, gold, platinum, titanium, lithium, aluminum, magnesium, copper, nickel, and others), metal-inclusive alloys (including multi-layers or two or more different metals, with or without an adhesion-promoting layer such as tungsten), or metal-inclusive compounds may be employed as the electrode 420, so long as the metallic electrode 420 is thin enough to be transparent, i.e., has a "transparent thickness." If the photodiode 400 is desired to be sensitive in the IR range, then the electrode 420 should be sufficiently transparent to IR wavelengths. The electrode 420 is typically fabricated on the underlying surface by a vacuum deposition technique such as, for example, chemical vapor deposition (CVD), metalorganic CVD (MOCVD), radio-frequency (RF) or magnetron sputtering, molecular beam epitaxy (MBE), ion beam epitaxy, laser MBE, pulsed laser deposition (PLD), or the like. Depending on the composition, other deposition techniques such as thermal evaporation or sublimation may be suitable. A conductive polymer if sufficiently transparent may alternatively be employed as the electrode 420, and may be deposited by a solution-based process, spin coating, dip coating, spray coating, etc. One non-limiting example of a transparent conductive polymer is poly(3,4-ethylenedioxythiophene): polystryenesulfonate (PEDOT:PSS) and its chemical relatives and derivatives. A layer of conductive carbon nanotubes (CNTs) or nano-sheets (e.g., graphene) may be employed as the electrode 420, and may or may not include a matrix material surrounding the CNTs or nano-sheets. Electrode materials may also be combined to form a composite electrode 120. One example is the use of a TCO, such as ITO, combined with a conductive polymer to improve the interface quality, such as PEDOT:PSS. In another embodiment (e.g., a flipped or inverse arrangement), the electrode 420 does not need to be transparent and may be selected from metals, metal-inclusive alloys, or metal-inclusive compounds. In some implementations, the electrode 420 has a work function less than 4.5 eV. One or both electrodes 420 or 416 should be transparent.

The electrode 416 may also be provided pursuant to the description above regarding the electrode 420. In the illustrated arrangement of the photodiode 400, the electrode 416 does not need to be transparent and thus its composition is typically selected from metals, metal-inclusive alloys, or metal-inclusive compounds. The electrode 416 may be selected based on its work function or its utility as an ohmic contact. The electrode 416 may cover the entire surface of the overlying QD layer 454 and/or underlying substrate 464 or a portion of the overlying and/or underlying surface, as necessary for collecting photogenerated electrons and providing an accurate measurable output to any signal processing circuitry that may be provided. Moreover, more than one physically distinct electrode 416 may be provided. In some implementations, the electrode 416 has a work function greater than 4.5 eV. In one specific example the electrode 416 is composed of aluminum.

The fullerene layer 452 includes a plurality of fullerenes. The fullerene layer 452 may have a thickness ranging from 3 nm to 300 nm. In the present context, thickness is defined in the vertical direction from the perspective of FIG. 1, with the understanding that no limitation is placed on the particular orientation of the photodiode 400 relative to any particular frame of reference. The fullerenes may be formed by various known techniques such as arc discharge between graphite electrodes. The fullerene layer 452 may further include a polymeric film or other suitable matrix material in which the fullerenes are dispersed. The fullerene layer 452 may be formed on the QD layer 454 by, for example, thermal evaporation, spin coating or any other deposition or film-forming technique suitable for providing a fullerene-inclusive layer of a desired thickness.

The QD layer 454 includes a plurality of quantum dots (QDs). The QD layer 454 may have a thickness ranging from 5 nm to 5 µm. In implementations typical to the present teachings, the QDs are composed of inorganic semiconductor materials. In one particularly advantageous yet non-limiting example, the QDs are lead sulfide (PbS) or lead selenide (PbSe) crystals or particles. More generally, QDs may be selected from various Group II-VI, Group Group III-V, Group IV, Group IV-VI, and Group V-VI materials. Examples include, but are not limited to, Group II-VI materials such as ZnS, ZnSe, ZnTe, ZnO, CdS, CdSe, CdTe, CdO, HgS, HgSe, HgTe, HgO, MgS, MgSe, MgTe, MgO, CaS, CaSe, CaTe, CaO, SrS, SrSe, SrTe, SrO, BaS, BaSe, BaTe, and BaO; Group materials such as CuInS$_2$, Cu(In,Ga)S$_2$, CuInSe$_2$, and Cu(In,Ga)Se$_2$; Group III-V materials such as AlN, AlP, AlAs, AlSb, GaN, GaP, GaAs, GaSb, InN, InP, InAs, and InSb; Group IV materials such as Si, Ge, and C; Group IV-VI materials such as GeSe, PbS, PbSe, PbTe, PbO, SnSe, SnTe, and SnS; and Group V-VI materials such as Sb$_2$Te$_3$, Bi$_2$Te$_3$, and Bi$_2$Se$_3$. Transition metal compounds such as the oxides, sulfides, and phosphides of Fe, Ni, and Cu may be applicable. Examples of QDs further encompass binary, ternary, quaternary, etc. alloys or compounds that include the foregoing species (e.g., SiGe, InGaAs, InGaN, InGaAsP, AlInGaP, etc.). Other QDs may include other types of semiconducting materials (e.g., certain organic and polymeric materials). For a QD having a core-shell structure, the shell may be composed of one of the foregoing species or other species, and the respective compositions of the core and the shell may be different—e.g., a core-shell composition might be CdSe—ZnS.

As appreciated by persons skilled in the art, the composition selected for the QDs may be based on a desired property such as band gap energy or wavelength sensitivity. As examples, QDs such as PbS, PbSe, PbTe, HgTe, InAs, InP, InSb, InGaAsP, Si, Ge or SiGe may be selected for IR sensitivity, while QDs such as CdS, CdSe or CdTe may be selected for visible sensitivity, and QDs such as ZnS or ZnSe for UV sensitivity. PbS and other IR-sensitive QDs are particularly useful in IR imaging devices. Blue-, UV-, and near-IR-absorbing QDs may also be selected. Moreover, the size of the QDs may be selected to absorb a desired range of electromagnetic radiation. Generally for a given species of QD below a critical size, a smaller size is more sensitive to shorter (bluer) wavelengths and a larger size is more sensitive to longer (redder) wavelengths, as demonstrated in the example of FIG. 2. Furthermore, the optoelectronic behavior of the QDs may be customized in dependence on their shape or their size distribution in the QD layer 454. Additionally, the QD layer 454 may include QDs of two or more different species (compositions) and/or two or more different specific sizes. This is useful when it is desired to extend the range of properties, behavior or performance of the QD layer 454. For example, a mixture of QDs in the QD layer 454 may be selected so that the QD layer 454 has enhanced responsiveness to different bands of electromagnetic spectra (e.g., visible and IR radiation, visible and UV radiation, etc.). Alternatively or additionally, more than one distinct QD layer 454 may be provided, each having a different composition or size of QDs. Two or more QD layers 454 may form a part of a corresponding number of separate QD-fullerene junctions 456 within the photodiode 400.

The QDs may be formed by various known techniques such as, for example, colloidal synthesis, plasma synthesis, vapor deposition, epitaxial growth, and nanolithography. The size, size distribution, shape, surface chemistry or other attributes of the QDs may be engineered or tuned to have desired properties (e.g., photon absorption and/or emission) by any suitable technique now known or later developed. The QD layer 454 may be formed on an underlying layer (e.g., the electrode 416 or an intervening layer) by any suitable method, particularly solution-based methods such as various known coating and printing methods, or doctor blading. In one example, the QDs are provided in a solution of an organic carrier solvent such as anisole, octane, hexane, toluene, butylamine, water, etc., with or without a matrix or host material, and are deposited to a desired thickness by spin-coating. Excess solvent may thereafter be eliminated by evaporation, vacuum or heat treatment. After formation, the QD layer 454 may or may not include residual solvent. The as-deposited QD layer 454 may be characterized as including a plurality, ensemble or array of QDs. The QDs may be closely packed, yet more or less free-standing, without inclusion of a matrix material. Without a matrix material, the QD layer 454 may be stabilized by London or Van der Waals forces, or may be linked by molecular species that form covalent bonds between adjacent QDs. Alternatively, the QDs may be dispersed to a desired density or concentration in a matrix material, which may be composed of a polymer, sol-gel or other material that can easily form a film on the intended underlying surface. Generally, the matrix material selected is chosen to enhance the optical-to-electrical conversion or other performance parameters of the QDs and of the photodiode 400 contemplated. One example of such a matrix material is a semiconducting polymer such as poly-3-hexylthiophene. Alternatively the QDs may be stabilized by treating them as described below to render the film less soluble.

According to an aspect of the present teaching, the QD layer 454 is formed in a manner that results in low-defect density, thereby reducing local pinholes and shorting in the QD layer 454. As one example, the QDs are provided in a solution that includes at least one solvent component with relatively low volatility (such as, for example, anisole) or improved wetting to the underlying substrate (such as, for example, octane or other alkanes). In another example, the QD-inclusive solution is applied as multiple coats to increase film thickness and/or reduce pinholes. In another example, a QD film is deposited as a first coat and then subjected to a post-deposition treatment as described below to render the film less soluble. Then, an additional QD film is deposited as a second coat on the treated first coat, which helps to passivate any defects/pinholes in the QD layer 454. The iteration of depositing QD-inclusive films followed by post-deposition treatment of each film may be repeated a number of times as needed to attain a desired layer thickness or reduction in defect density.

According to an aspect of the present teaching, the as-formed QD layer 454 may be subjected to a post-deposition process or treatment that improves the electronic transport properties of the QDs and consequently improves the performance of the photodiode 400. This is accomplished by exposing the QDs to a selected chemistry such as by immersing the QD layer 454 (and underlying structure) in the chemical solution. Alternatively the as-formed QD layer 454 may undergo the treatment by exposing it to a vapor phase atmosphere that includes the selected chemical or chemicals. The chemical(s) utilized for treating the QD layer 454 may improve the charge carrier mobility and passivate defects or unsaturated surface bonds in the QD layer 454. In addition to improving the electronic properties of the QDs, the chemical treatment may result in substantial modification of the film morphology. After chemical treatment the QD layer 454 may show an increased optical density, increased dot packing fraction, and/or increased mechanical and chemical robustness. These changes in the QD film morphology further contribute to the significant increase in charge carrier mobility and improvement in device performance. Examples of chemicals that may be utilized for the post-deposition treatment include one or more of the following: ethanethiol, alkyl-thiols, alkenyl-thiols, alkynyl-thiols, aryl-thiols, ethanedithiol, benzendithiol, alkyl-polythiols, alkenyl-polythiols, alkynyl-polythiols, aryl-polythiols, carboxylic acids, formic acid, methanol, toluene, isopropyl alcohol, chloroform, acetonitrile, acetic acid, butyl amine, 1,4 butyl diamine, alkyl-amines, alkenyl-amines, alkynyl-amines, aryl-amines alkyl-polyamines, alkenyl-polyamines, alkynyl-polyamines, and aryl-polyamines The treatment may be applied as a liquid solution or a vapor.

Prior to the post-deposition process the QD layer 454 may, for example, have a charge carrier mobility in the range of $10^{-6}$-$10^{-4}$ cm²/V-sec. As a result of the post-deposition process the QD layer 454 may, for example, have a charge carrier mobility in the range of greater than $1\times10^{-4}$ cm²/V-sec, or in another example in the range of greater than $1\times10^{-4}$ to 10 cm²/V-sec. It is understood herein that QD layers that undergo a post-deposition chemical treatment to achieve a mobility >$10^{-4}$ cm²/V-sec are considered to be high mobility QD layers. One of the characteristics of the high mobility QD layers may be a shorter distance between the surfaces of two adjacent QDs. This distance is called the interparticle spacing and may be 3 nm or greater for as-deposited QD layers and 2 nm or less for high mobility QD layers. The thickness of the high mobility QD layer may be reduced by 20% to 80% compared to the as-deposited QD layer because of the reduction in interparticle spacing. In another example, the thickness of the high mobility QD layer may be reduced by 40% to 70% compared to the as-deposited QD layer. An example of a reduction in thickness as a result of treatment of the QD layer is described below in conjunction with FIGS. 7A and 7B.

Figure 5:
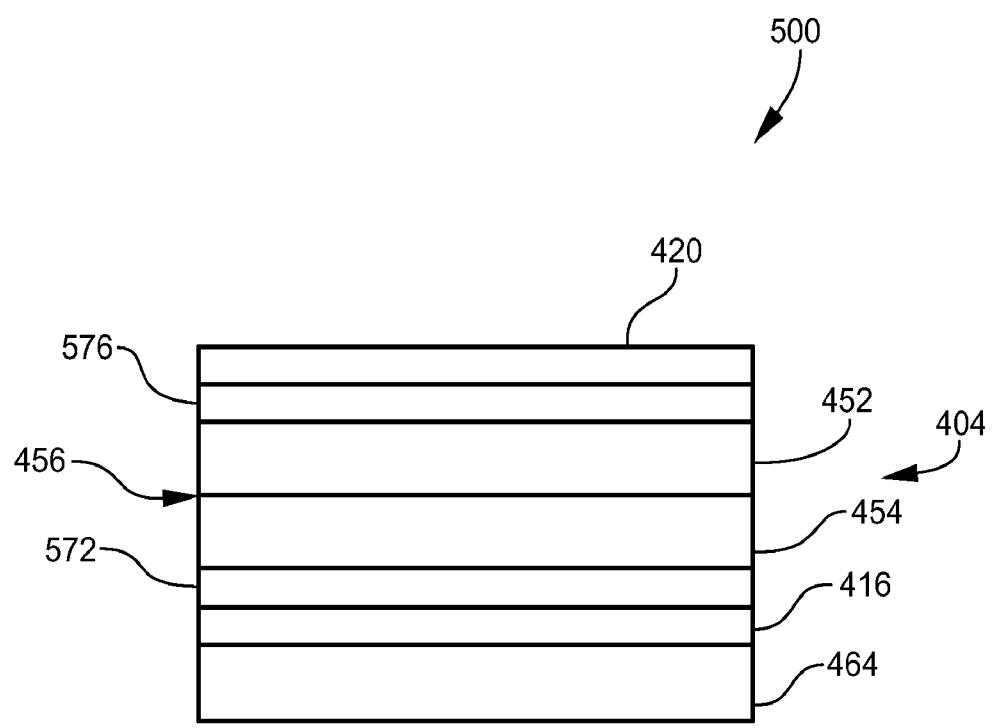
FIG. 5 is a cross-sectional view of another example of a photodiode device according to certain implementations of the present disclosure.

FIG. 5 is a schematic cross-sectional view of another example of a photodiode 500 according to certain implementations of the present disclosure. In this implementation, one or more additional layers of materials are provided to improve a performance-related attribute such as quantum efficiency. For example, a hole blocking layer 576 may be interposed between the fullerene layer 452 and the electrode 420 to prevent holes from traveling toward the electrode 420 and possibly combining with a free electron near the electrode surface. The hole blocking layer 576 may be composed of any organic or inorganic material suitable for providing the hole blocking function. Examples include, but are not limited to, inorganic compounds such as $TiO_2$ or ZnO, organic compounds such as 2,9-dimethyl-4,7-diphenyl-1,10-phenanthroline (bathocuproine or BCP), 4,7-diphenyl-1,10-phenanthroline (bathophenanthroline or BPhen), 2,9-bis(naphthalen-2-yl)-4,7-diphenyl-1,10-phenanthroline (NBPhen), or a metal chelate complex such as tris-8-hydroxy-quinolinato aluminum (Alq3), and chemical relatives and derivatives of the foregoing. Several organic compounds conventionally utilized as electron transporting or hole blocking layers in organic optoelectronic devices may be effective as the hole blocking layer 576 in the present implementation. The hole blocking layer 576 may also include a doped layer that provides enhanced carrier concentration. Dopants may include organic molecules or alkali metals such as lithium or cesium. The thickness of the hole blocking layer 576 will generally depend on its composition. In some examples, the thickness of the hole blocking layer 576 ranges from 1 nm to 100 nm.

In other implementations, in addition or as an alternative to the hole blocking layer 576, the photodiode 500 may include an electron blocking layer 572 interposed between the electrode 416 and the QD layer 454 to prevent electrons from traveling toward the electrode 416 and possibly combining with a hole. The electron blocking layer 572 may be composed of any organic or inorganic material suitable for providing the electron blocking function. Examples include, but are not limited to, molybdenum trioxide ($MoO_3$), tungsten trioxide ($WO_3$), copper oxide ($CuO_x$), nickel oxide ($NiO_x$) a phthalocyanine such as copper phthalocyanine (CuPc) or tin phthalocyanine (SnPc) (but not limited to metal-Pc compounds), 4,4',4''-tris(3-methylphenylphenylamino)-triphenylamine (m-MTDATA), N,N'-bis(1-naphthyl)-N,N'-diphenyl-(1,1'-biphenyl)-4,4'-diamine (α-NPD), and chemical relatives and derivatives of the foregoing. Additionally, QDs that have potential energies that are different than the QDs in layer 108 may be employed as the electron blocking layer 244. Materials with high conductivity are generally not suitable as charge recombination may occur within or adjacent to these layers. It may be desirable to modify the properties of the electron blocking layer 244 after it is deposited to improve its effectiveness. These treatments can include annealing in various oxidizing or reducing atmospheres or exposure to an oxidizing or reducing plasma. Appropriate oxidizing or reducing species and reaction chambers are known to persons skilled in the art and thus need not be described in detail herein. Several organic compounds conventionally utilized as hole transporting or electron blocking layers in organic optoelectronic devices may be effective as the electron blocking layer 572 in the present implementation. The thickness of the electron blocking layer 572 will generally depend on its composition. In some examples, the thickness of the electron blocking layer 572 ranges from 1 nm to 100 nm.

In some implementations, it may be advantageous for the electron blocking layer 572 to be fabricated such that it only partially covers the electrode 416. An electron blocking layer 572 providing partial coverage may be termed a discontinuous layer or film. A discontinuous electron blocking layer 572 may provide the best combination of exciton and/or electron blocking capability while allowing efficient transport of holes to the electrode 416. This partial coverage may be formed by known patterning techniques, or by depositing the film under appropriate conditions such that it results in only partial coverage. Examples of patterning techniques include, but are not limited to, the use of masks, deposition by ink-jet printing, etc. In some implementations, the discontinuous electron blocking layer 572 has a configuration in which islands or regions of the electron blocking material are separated or surrounded by areas that do not contain the electron blocking material (i.e., the absence of electron blocking material at the planar level of the electron blocking layer 572). In other implementations, the discontinuous electron blocking layer 572 has a configuration in which areas not containing the electron blocking material are surrounded by the electron blocking material. Hence, in a discontinuous electron blocking layer 572 the majority of the planar area of the electron blocking layer 572 may or may not be occupied by the electron blocking material. When a discontinuous electron blocking layer 572 is provided as a pattern, the pattern may be regular or irregular. Examples of patterns include, but are not limited to, a series of stripes, an array of polygons, an array of circles or dots, etc.

Depending on its composition and the properties of the semiconductor layer with which it is interfaced, a hole blocking layer 576 and/or an electron blocking layer 572 such as those noted above may also serve as an exciton blocking layer to confine photogenerated excitons to the region of the heterojunction where they need to be dissociated and to keep them away from the electrode/semiconductor interfaces. Anode-side and/or cathode-side exciton blocking layers may also be provided in addition to the hole blocking layer 576 and/or the electron blocking layer 572. As appreciated by persons skilled in the art, the composition of the exciton blocking layer may be dictated by whether it is positioned adjacent to an anode (e.g., the electrode 416) or a cathode (e.g., the electrode 420), so that the exciton blocking layer does not impair hole transport or electron transport in the relevant direction. It is also appreciated that hole blocking layers, electron blocking layers, and exciton blocking layers may be doped with other compounds as needed for a variety of purposes such as enhancing mobility or stabilizing their structures. Moreover, these types of layers may also be desirable as protective layers to protect as-deposited underlying layers during the fabrication process. Persons skilled in the art will appreciate the applicability of chemical derivatives or relatives of the foregoing examples of materials, as well as similarly behaving alternatives of such materials, that may be utilized as a hole blocking layer, an electron blocking layer, and an exciton blocking layer.

If organic compositions are selected for the hole blocking layer 576, the electron blocking layer 572, and/or any additional exciton blocking layer(s), such organic layers may be deposited in the same deposition chamber utilized for growing or depositing the electrode 420 and/or 416. In this case, organic layers may be deposited by organic vapor-phase deposition (OPVD), organic molecular beam deposition, or any other suitable deposition technique. Alternatively, organic layers may be deposited by spin-coating, dip coating, spray coating, ink-jet printing, gravure printing, screen printing, contact printing, evaporation, sublimation, or the like.

In another implementation, the photodiode device 400 or 500 may be fabricated by reversing the order of layers described herein, such that the QD layer 454 is deposited onto the fullerene layer 452. It is understood that the properties of the heterojunction 456 and the function of the constituent layers remain the same.

The unique QD-fullerene heterojunction 456 constitutes a substantial improvement over previously known heterojunctions. In particular, the QD-fullerene heterojunction 456 exhibits increased light absorption and light absorption at wavelengths not typically accessible by other heterojunctions. A consequence of the improved light absorption is a higher photocurrent density. The heterojunction 456 exhibits more efficient charge separation of photogenerated excitons and more efficient charge carrier collection as compared to devices based on other types of heterojunctions. In one example, the improvement includes the post-deposition treatment of the QD layer 454 to improve the charge transport properties of this layer 454. This technique increases charge separation efficiency, increases charge extraction efficiency, lowers the series resistance, and allows the use of a thicker QD layer 454 without reducing efficiency. Another improvement is the use of an electron blocking layer 572 as described above, which increases charge separation efficiency by reducing exciton recombination at the electrode-QD layer interface, and helps to limit the deleterious effects of defects in the QD layer 454. The electron blocking layer 572 functions as a tunneling junction or an ohmic junction in the extraction of photogenerated holes and enables high-efficiency photodetection while maintaining very low dark currents and thus very high signal-to-noise ratio.

Photodetectors based on photodiodes such as described herein may be configured to be responsive to any combination of IR, visible and UV ranges as desired for a particular application. The spectral responsiveness depends on the QDs utilized in terms of size, composition, doping, or other chemical or surface modification (if any), and other properties or characteristics. As previously noted, the type of QDs utilized in a given layer may be uniform or may be an ensemble of different types of QDs as needed to achieve a desired performance. In some examples, a photodiode as provided according to the present disclosure is responsive to incident photons at wavelengths ranging from 250-1400 nm or 250-1500 nm. The use of appropriately sized PbS or similar QDs is a specific example of the foregoing. In other examples, the photodiode may be responsive to the range of 250-1700 nm In other examples, the photodiode may be responsive to the range of 250-2400 nm. Moreover, a given photodetector may exhibit a range of quantum efficiencies dependent on the incident wavelength. For example, the photodetector may exhibit an external quantum efficiency of 15% or greater, while in other examples may exhibit an external quantum efficiency of 25%-95%.

Figure 6:
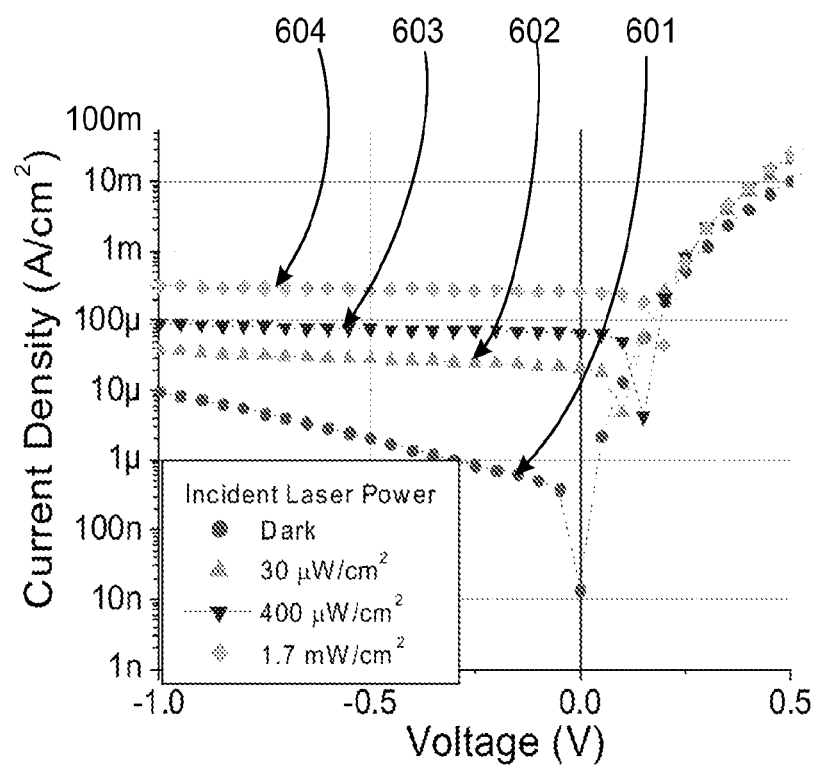
FIG. 6 is a set of plots of current density as a function of voltage under dark and illuminated conditions of different powers for an example of a photodiode device fabricated according to one implementation of the present disclosure.

Optoelectronic devices implementing a QD-fullerene heterojunction 456 as described herein have exhibited performance characteristics demonstrating some of the advantages of this heterojunction. In one example, a photodiode device was fabricated for testing purposes based on the structure illustrated in FIG. 4 (without underlying signal processing circuitry) and included the electron blocking layer 572 illustrated in FIG. 5. In the test device, the substrate 464 was transparent. A 2 nm thick $MoO_3$ electron blocking layer 572 was deposited on a glass substrate 464 coated with an ITO electrode 416. The QD layer 454 was formed on the electron blocking layer 572 by spin coating a solution of butylamine-capped PbS QDs in octane with a concentration of 50 mg/ml. After allowing excess solvent to evaporate, the resulting QD layer 454 had a thickness of approximately 80 nm. The QD layer 454 was then treated by immersion in 5% formic acid in acetonitrile for 5 minutes. The fullerene layer 452 was then formed on the QD layer 454 by thermal evaporation of a 50 nm layer of $C_{60}$ fullerenes. A 13 nm layer of BCP was then formed on the fullerene layer 452 by thermal evaporation to serve as a hole blocking layer 576. An electrode 420 was then deposited on the BCP consisting of a 50 nm thick layer of Al followed by a 50 nm thick layer of Ag. A laser source was configured to produce irradiance at various power levels (mW). Using this laser source, the glass-side of the photodiode device was irradiated with monochromatic 980-nm illumination, with the sample at ambient temperature and without protection from ambient oxygen and moisture. The area of the electrode 420 was measured using a calibrated microscope to be ~0.8 $mm^2$ FIG. 6 is a set of plots of current density as a function of voltage under dark and illuminated conditions of different optical powers. Specific I-V curves were taken under illumination conditions as as follows: 601 (Dark); 602 (30 $\mu W/cm^2$); 603 (400 $\mu W/cm^2$);and 604 (1700 $\mu W/cm^2$). The current was measured as a function of applied voltage using a Keithley 2400 SourceMeter power supply/meter to produce the I-V data in FIG. 6.

This sample photodiode device exhibited quantum efficiencies (ratio of measured electrons to incident photons) of about 21% at 980 nm.

The charge carrier mobility of the QD layers was measured using the field effect mobility technique. QD films were fabricated on separate substrates, but employing identical process steps for the QD layer as those in the photodiode devices. In this method a thin film field effect transistor (FET) is fabricated using QDs and the FET mobility is extracted from the measurement of the gate voltage versus drain current transfer curve of the device. If the charge carrier mobility is measured by other techniques, or using a different physical implementation of the QD layer, or under different conditions, such as at a different temperature, a different measured value may be obtained. Therefore the term mobility in this context refers to the values measured using field effect technique and the device structure described herein, with measurements made at ambient temperatures, and using a QD layer in the FET device that is processed in an identical manner to the QD layer used in the PV device. Furthermore, mobility in certain material systems is known to have a dependence on applied voltage. All of the mobility values described here are for device with source-gate and source-drain voltages spanning the range of −20V to +20V.

The FET device is fabricated as follows. First, a 50 nm thick $SiO_2$ layer is grown by thermal oxidation of a conductive crystalline silicon substrate. The substrate serves as the gate electrode and the $SiO_2$ serves as the gate dielectric. Gold (Au) source and drain electrodes are patterned and deposited onto the $SiO_2$. The source and drain electrodes are separated by a 5 μm wide gap which is the FET channel length, and are 2.5 mm wide which is the FET channel width. The QD layer is deposited by spin coating a solution of QDs onto the FET substrate, forming a film of material that lies on top of the gate dielectric, and connects the source and drain electrodes. The combination of the gate electrode, the gate dielectric, the source and drain electrodes, and the QD film, form the FET device.

To measure the mobility of the QD film a fixed voltage is applied between the source and drain electrodes and the current between them is measured. The fixed voltage is chosen to be in the portion of the FET response where source-drain current varies linearly with drain voltage, commonly known as the linear regime. The gate voltage is then varied and the source-drain current is measured for each value of gate voltage. The plot of gate voltage versus source drain current is the transfer curve of the FET device. The QD mobility is extracted using the slope of the transfer curve, the value of the voltage applied between the source and drain electrodes, and the geometry of the device structure according to the equation $g_m = WC_i V_{ds}/L \mu$ where $g_m$ (the transconductance) is the slope of the transfer curve, W is the transistor width, $C_i$ is the gate oxide capacitance, L is the transistor length, $V_{ds}$ is the applied drain-source voltage, and μ is the FET mobility.

Devices fabricated with high QD mobility had a measured FET mobility of $4.5 \times 10^{-3}$ cm$^2$/V-s. The formic acid treatment employed in the fabrication of the QD films in this example is one method for obtaining QD films with mobilities greater than $1 \times 10^{-4}$ cm$^2$/V-s, however other methods and variations are also possible as indicated above.

Figure 7A:
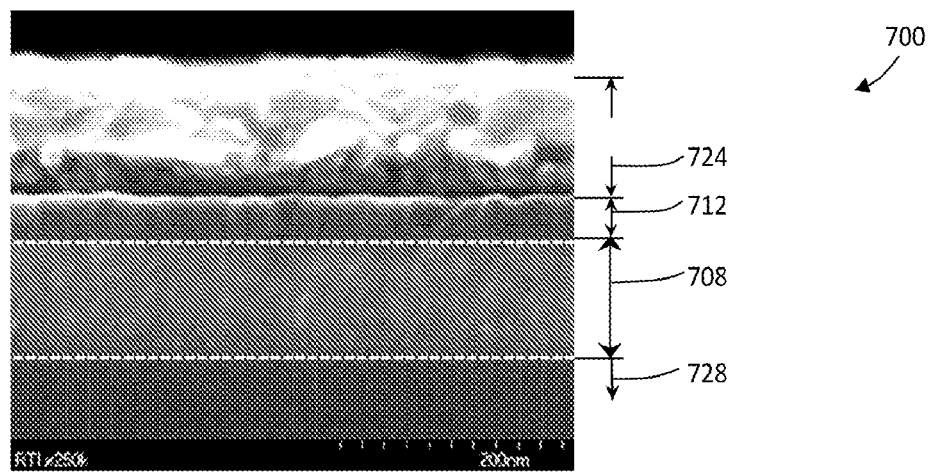
FIG. 7A is an SEM image of a composite structure that includes a quantum dot/fullerene heterojunction fabricated in accordance with the present disclosure.
Figure 7B:
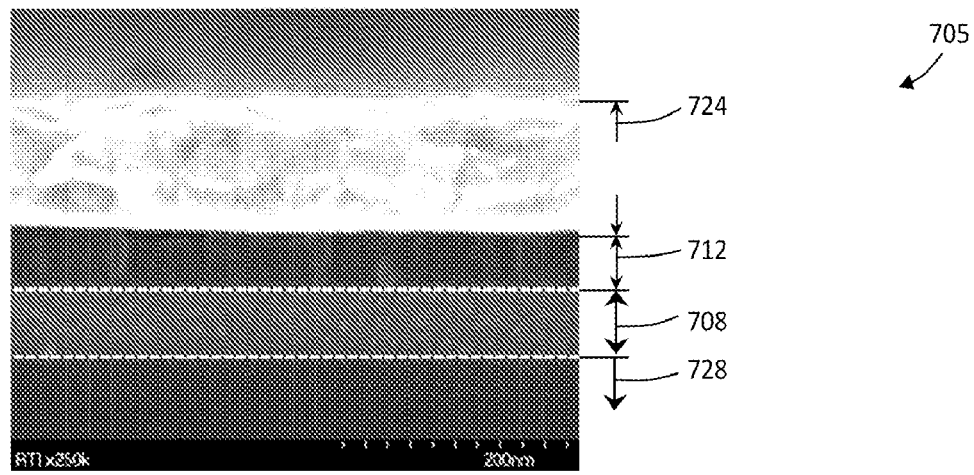
FIG. 7B is an SEM image similar to FIG. 7A, but in which the quantum dots have been treated in accordance with a technique disclosed herein.

FIG. 7A is an SEM (scanning electron microscopy) image of a composite structure 700 that includes a quantum dot/fullerene heterojunction fabricated in accordance with the present disclosure for testing purposes. FIG. 7B is an SEM image of a composite structure 705 similar to FIG. 7B, but in which the quantum dots have been treated in accordance with a technique disclosed herein. In each case, the material system is as follows: silicon substrate 728/lead sulfide (PbS) QD layer 708/$C_{60}$ and hole blocking layer 712/metal contact 724. The two composite structures 700 and 705 were fabricated in an identical manner, with the exception of the QD layer 708. In the composite structure 700 of FIG. 7A, the PbS QDs were untreated and the QD layer 708 had a thickness of 92 nm. By comparison, in the composite structure 705 of FIG. 7B, the PbS QDs after deposition were modified by a treatment of formic acid. This treatment caused a reduction in interparticle spacing in the QD layer 708 of the composite structure 705, thereby resulting in a reduction in film thickness. The thickness of the resulting formic acid treated QD layer 708 in the composite structure 705 was measured to be 52 nm.

In other implementations, a photodiode device 400 or 500 as described herein may include multiple active electronic junctions or subcells, which may improve efficiency. For instance, the photodiode device may have a stacked configuration that includes alternating or periodic fullerene layers 452 and QD layers 454. Optionally, conductive (charge transporting) layers may be interposed between each QD-fullerene bilayer heterostructure 404. As another alternative, the photodiode device may have a stacked configuration that includes at least one QD-fullerene bilayer heterostructure 404 and one or more additional heterojunctions formed by other types of electron donor and electron acceptor materials (e.g., organic heterojunctions, inorganic heterojunctions). In this latter case, the QD-fullerene bilayer heterostructure 404 may be provided for a specific purpose (e.g., IR sensitivity) while the other type of heterostructure is provided for a different purpose (e.g., visible light sensitivity).

The various layers of materials are schematically depicted in FIGS. 4 and 5 as being planar. It will be understood, however, that the photodiodes and associated photodetectors disclosed herein are not limited to any particular geometry. The photodiodes and associated photodetectors may have a curved profile or some other shape. Moreover, depending on the materials utilized, the photodiodes and associated photodetectors may be flexible.

The interface between the fullerene layer 452 and the QD layer 454 is schematically depicted in FIGS. 4 and 5 as being planar. It will be understood, however, that the junction may not be smooth or abrupt. It is possible that the junction includes a mixed region that contains both quantum dots and fullerenes. It is also possible that the layers are formed in such a way that regions of quantum dots and fullerenes form a network of interpenetrating regions that are predominantly quantum dots and predominantly fullerenes, respectively. Additionally, vertical structures such as pillars, pores, mesas, or other microscale or nanoscale structures that provide increased heterojunction area per unit substrate area may be used to enhance or manipulate light absorption. Such structures may employ the same heterojunction as the planar structure, but in these other examples the junction may be extended in three dimensions.

In other implementations, the system of layers illustrated in FIGS. 4 and 5 may be utilized, or modified and certain layers omitted or added as needed, to produce a PV device, or a light-emitting diode (LED) or other type of electroluminescent or photoluminescent device useful as a light source or for transmission of information, as described in above-referenced U.S. Provisional App. No. 61/246,679.

While examples of QD-fullerene junction based devices have been described herein primarily in the context of optoelectronics, persons skilled in the art will appreciate that the QD-fullerene heterostructure 404 taught herein may be applied to microelectronic devices in general. That is, the use of the QD-fullerene heterostructure 404 as an electronic junction is not limited to photo-specific applications. As non-limiting examples, the QD-fifllerene structure 404 may be utilized in a display device (e.g., flat panel display), a transistor, an optical MEMS device, a microfluidic device, a lab-on-a-chip, a surgically implantable device, etc.

In general, terms such as "communicate" and "in . . . communication with" (for example, a first component "communicates with" or "is in communication with" a second component) are used herein to indicate a structural, functional, mechanical, electrical, signal, optical, magnetic, electromagnetic, ionic or fluidic relationship between two or more components or elements. As such, the fact that one component is said to communicate with a second component is not intended to exclude the possibility that additional components may be present between, and/or operatively associated or engaged with, the first and second components.

It will be understood that various aspects or details of the invention may be changed without departing from the scope of the invention. Furthermore, the foregoing description is for the purpose of illustration only, and not for the purpose of limitation—the invention being defined by the claims.

What is claimed is:

1. A photodetector, comprising:
a photodiode comprising a transparent first electrode, a second electrode, and a heterojunction interposed between the first electrode and the second electrode, the heterojunction comprising a quantum dot layer and a fullerene layer disposed directly on the quantum dot layer, the quantum dot layer comprising a plurality of quantum dots and the fullerene layer comprising a plurality of fullerenes; and
a signal processing circuit in signal communication with the second electrode.

2. The photodetector of claim 1, wherein the photodiode is configured for outputting a signal to the signal processing circuit responsive to incident photons at wavelengths selected from the group consisting of an infrared range, a visible range, an ultraviolet range, and a combination of two or more of the foregoing.

3. The photodetector of claim 1, wherein the photodiode is configured for outputting a signal to the signal processing circuit responsive to incident photons at wavelengths ranging from about 250 nm to about 2400 nm.

4. The photodetector of claim 1, wherein the first electrode or the second electrode are selected from the group consisting of conductive oxides, metals, metal alloys, metal-inclusive compounds, CNTs, graphene, and conductive polymers.

5. The photodetector of claim 1, wherein the quantum dots have a composition selected from the group consisting of Group II-VI, Group I-III-VI, Group III-V, Group IV, Group IV-VI, and Group V-VI materials.

6. The photodetector of claim 1, wherein the quantum dots are composed of lead sulfide, lead selenide, lead telluride, mercury telluride, or alloys thereof.

7. The photodetector of claim 1, wherein the quantum dot layer has a thickness ranging from 5 nm to 5 μm.

8. The photodetector of claim 1, wherein the plurality of quantum dots comprises a plurality of first quantum dots and a plurality of second quantum dots, and the first quantum dots have a first average size and the second quantum dots have a second average size different from the first average size, or the first quantum dots have a first composition and the second quantum dots have a second composition different from the first composition.

9. The photodetector of claim 1, wherein the fullerenes are selected from the group consisting of $C_n$ fullerenes where n is 20 or greater, endohedral fullerenes, fullerene derivatives, and a combination of two or more of the foregoing.

10. The photodetector of claim 1, wherein the fullerene layer has a thickness ranging from 3 nm to 300 nm.

11. The photodetector of claim 1, further comprising a hole blocking layer interposed between the fullerene layer and the second electrode.

12. The photodetector of claim 1, further comprising an electron blocking layer interposed between the first electrode and the quantum dot layer.

13. The photodetector of claim 12, wherein the electron blocking layer comprises a discontinuous layer.

14. The photodetector of claim 13, wherein the electron blocking layer comprises a pattern of electron blocking material.

15. The photodetector of claim 1, wherein the quantum dot layer exhibits a charge carrier mobility greater than $1\times10^{-4}$ cm$^2$/V-sec.

16. The photodetector of claim 1, wherein the quantum dot layer exhibits an interparticle spacing of 2 nm or less.

17. A photodetector, comprising:
a plurality of photodiodes, each photodiode comprising a transparent first electrode, a second electrode, and a heterostructure interposed between the first electrode and the second electrode, each heterostructure comprising a quantum dot layer and a fullerene layer disposed directly on the quantum dot layer, each quantum dot layer comprising a plurality of quantum dots and each fullerene layer comprising a plurality of fullerenes; and
a signal processing circuit in signal communication with each second electrode.

18. The photodetector of claim 17, wherein the plurality of photodiodes comprises a first group of photodiodes configured for outputting respective signals responsive to incident photons of a first wavelength range, and a second group of photodiodes configured for outputting respective signals responsive to incident photons of a second wavelength range different from the first wavelength range, and wherein the first wavelength range and the second wavelength range are selected from the group consisting of infrared, visible, ultraviolet, and a combination of two or more of the foregoing.

19. A method for fabricating a photodetector, the method comprising:
forming a heterostructure on a first electrode, the heterostructure comprising a quantum dot layer and a fullerene layer in contact with each other, the quantum dot layer comprising a plurality of quantum dots and the fullerene layer comprising a plurality of fullerenes;
forming a second electrode on a side of the heterostructure opposite to the first electrode wherein one or both of the first or second electrodes is transparent; and
placing the first electrode in signal communication with a signal processing circuit.

20. The method of claim 19, comprising fabricating a plurality of photodiodes by forming a plurality of heterostructures on a plurality of respective first electrodes, each heterostructure comprising a respective quantum dot layer and a respective fullerene layer in contact with each other, wherein the transparent second electrode is formed on a side of the heterostructures opposite to the first electrodes, and wherein each first electrode is placed in signal communication with the signal processing circuit.

21. The method of claim 19, comprising fabricating a plurality of photodiodes by forming a heterostructure on a plurality of respective first electrodes, wherein each first electrode is placed in signal communication with the signal processing circuit and defines a respective photodiode.

22. The method of claim 19, wherein forming the heterostructure comprises depositing the quantum dot layer by depositing a solution comprising the plurality of quantum dots and a solvent.

23. The method of claim 22, wherein the solvent is selected from the group consisting of toluene, anisole, alkanes, butylamine, and water.

24. The method of claim 19, wherein forming the heterostructure comprises depositing the quantum dot layer, followed by treating the quantum dot layer with a chemistry that increases the charge carrier mobility of the quantum dot layer.

25. The method of claim 24, wherein the quantum dot layer is treated with a solution or vapor having a composition selected from the group consisting of ethanethiol, alkyl-thiols, alkenyl-thiols, alkynyl-thiols, aryl-thiols, ethanedithiol, benzendithiol, alkyl-polythiols, alkenyl-polythiols, alkynyl-polythiols, aryl-polythiols, carboxylic acids, formic acid, methanol, toluene, isopropyl alcohol, chloroform, acetonitrile, acetic acid, butyl amine, 1,4 butyl diamine, alkyl-amines, alkenyl-amines, alkynyl-amines, aryl-amines alkyl-polyamines, alkenyl-polyamines, alkynyl-polyamines, aryl-polyamines.

26. The method of claim 19, wherein forming the heterostructure comprises depositing a first quantum dot layer, followed by depositing one or more additional quantum dot layers on the first quantum dot layer.

27. The method of claim 26, further comprising, after depositing the first quantum dot layer and the additional quantum dot layers, treating the as-deposited quantum dot layers simultaneously with a solution or vapor having a composition selected from the group consisting of ethanethiol, alkyl-thiols, alkenyl-thiols, alkynyl-thiols, aryl-thiols, ethanedithiol, benzendithiol, alkyl-polythiols, alkenyl-polythiols, alkynyl-polythiols, aryl-polythiols, carboxylic acids, formic acid, methanol, toluene, isopropyl alcohol, chloroform, acetonitrile, acetic acid, butyl amine, 1,4 butyl diamine, alkyl-amines, alkenyl-amines, alkynyl-amines, aryl-amines alkyl-polyamines, alkenyl-polyamines, alkynyl-polyamines, and aryl-polyamines.

28. The method of claim 26, further comprising, after depositing the first quantum dot layer and each additional quantum dot layer, treating the as-deposited quantum dot layer with a solution or vapor prior to depositing the next quantum dot layer, the solution or vapor having a composition selected from the group consisting of ethanethiol, alkyl-thiols, alkenyl-thiols, alkynyl-thiols, aryl-thiols, ethanedithiol, benzendithiol, alkyl-polythiols, alkenyl-polythiols, alkynyl-polythiols, aryl-polythiols, carboxylic acids, formic acid, methanol, toluene, isopropyl alcohol, chloroform, acetonitrile, acetic acid, butyl amine, 1,4 butyl diamine, alkyl-amines, alkenyl-amines, alkynyl-amines, aryl-amines alkyl-polyamines, alkenyl-polyamines, alkynyl-polyamines, and aryl-polyamines.

29. The method of claim 19, comprising depositing an electron blocking layer on the first electrode, wherein the quantum dot layer is deposited on the electron blocking layer.

30. The method of claim 29, comprising subjecting the electron blocking layer to an oxidizing or reducing treatment.

31. The method of claim 19, comprising depositing a hole blocking layer on the fullerene layer, wherein the second electrode is deposited on the hole blocking layer.

32. The method of claim 19, comprising treating the quantum dot layer with a chemistry selected from a chemistry that reduces an interparticle spacing between quantum dots, a chemistry that reduces an as-deposited thickness of the quantum dot layer, or a chemistry that both reduces the interparticle spacing and the as-deposited thickness of the quantum dot layer.

33. The method of claim 32, comprising reducing the interparticle spacing to 2 nm or less, or reducing the as-deposited thickness by 20 to 80%.

* * * * *